United States Patent [19]

Kagawa et al.

[11] Patent Number: 5,051,374

[45] Date of Patent: Sep. 24, 1991

[54] METHOD OF MANUFACTURING A SEMICONDUCTOR DEVICE WITH IDENTIFICATION PATTERN

[75] Inventors: Takayoshi Kagawa, Nara; Suehiro Ishikura, Fukuyama, both of Japan

[73] Assignee: Sharp Kabushiki Kaisha, Osaka, Japan

[21] Appl. No.: 499,651

[22] Filed: Mar. 27, 1990

Related U.S. Application Data

[60] Division of Ser. No. 467,334, Jan. 19, 1990, Pat. No. 4,951,116, which is a continuation of Ser. No. 240,393, Aug. 29, 1988, abandoned, which is a continuation of Ser. No. 830,541, Feb. 18, 1986, abandoned.

[30] Foreign Application Priority Data

Mar. 6, 1985 [JP] Japan .................................. 60-45334

[51] Int. Cl.⁵ .............................................. H01L 21/66
[52] U.S. Cl. ........................................ 437/8; 437/924; 148/DIG. 102
[58] Field of Search ............... 437/8, 924, 980, 238, 437/240; 148/DIG. 102

[56] References Cited

U.S. PATENT DOCUMENTS

| | | | |
|---|---|---|---|
| 4,125,418 | 11/1978 | Vinton | 148/175 |
| 4,233,091 | 11/1980 | Kawabe | 148/175 |
| 4,305,760 | 12/1981 | Trudel | 148/1.5 |
| 4,362,766 | 12/1982 | Dannhäuser et al. | 427/39 |
| 4,450,041 | 5/1984 | Aklufi | 156/628 |
| 4,522,656 | 6/1985 | Kuhn-Kuhnenfell | 148/1.5 |

FOREIGN PATENT DOCUMENTS

| | | | |
|---|---|---|---|
| 2228298 | 12/1973 | Fed. Rep. of Germany . | |
| 2642770 | 4/1977 | Fed. Rep. of Germany . | |
| 0016415 | 1/1985 | Japan | 437/87 |

*Primary Examiner*—Olik Chaudhuri
*Assistant Examiner*—M. Wilczewski
*Attorney, Agent, or Firm*—Irell & Manella

[57] ABSTRACT

A semiconductor device with an identification pattern is manufactured by forming a field oxide layer on its substrate, implanting impurity ions on this layer through a patterned mask and exposing the layer to an etching liquid after the mask is removed. A pattern is formed on the device due to a difference in the rate of etching between ion-implanted and masked parts.

6 Claims, 1 Drawing Sheet

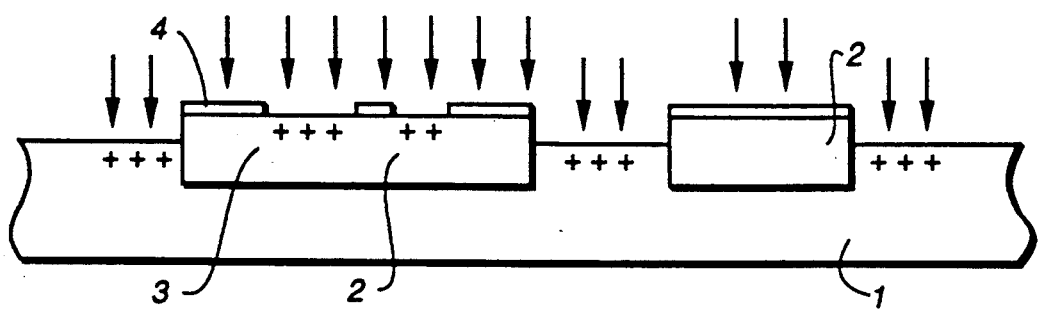
FIG._1
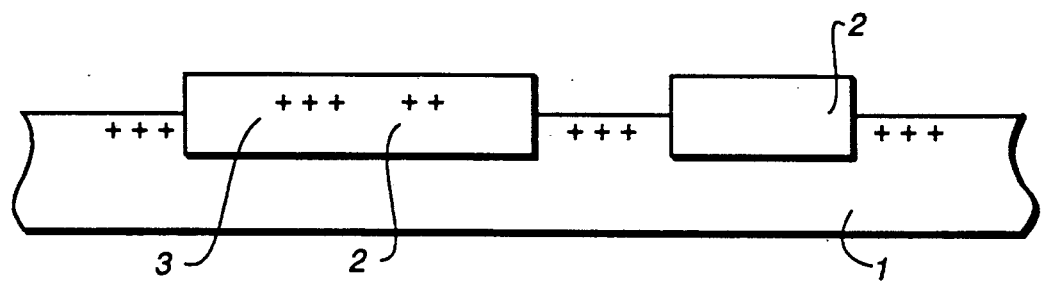
FIG._2
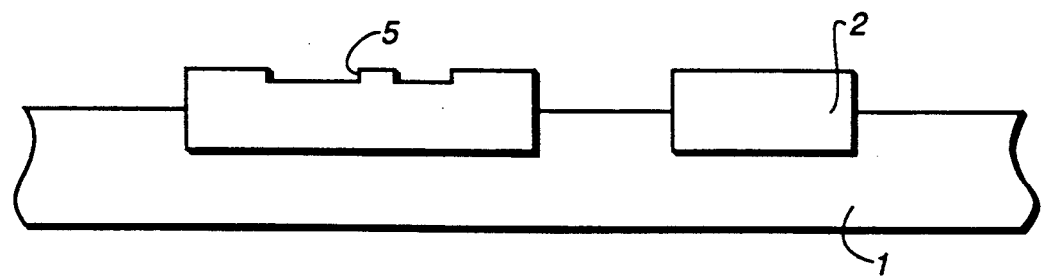
FIG._3
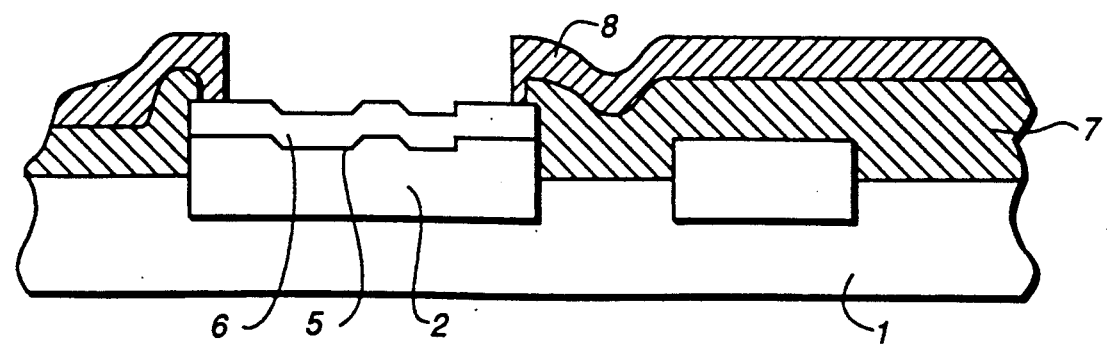
FIG._4

METHOD OF MANUFACTURING A SEMICONDUCTOR DEVICE WITH IDENTIFICATION PATTERN

BACKGROUND OF THE INVENTION

This is a divisional of application Ser. No. 467,334 filed Jan. 19,1990, now U.S. Pat. No. 4,951,116, which is a continuation of application Ser. No. 240,393 filed Aug. 29, 1988, now abandoned, which is a continuation of application Ser. No. 830,541 filed Feb. 18, 1986, now abandoned.

This invention relates to a method of manufacturing a semiconductor device such as a read-only memory of the type into which data are written by ion implantation and more particularly to a method of manufacturing such a semiconductor device of which the element areas are separated by a field $SiO_2$ layer with unevenness formed by etching on its surface to provide a pattern for chip identification.

Data of various types are written into read-only memories (ROM) in one of the steps during their production process. Such data may be written in by selecting diffusion areas, by determining whether wiring should be effected or not, or by selectively implanting impurity ions. When data are written in by a diffusion method or a contact method, surface deformations are involved and the chips with different data written in can easily be distinguished by visually inspecting the patterns formed on their surfaces. If an ion implantation method is used to write in data, however, no deformations appear on the chip surface and it is difficult to make distinctions among different chips by visual inspection alone. For this reason, special care must be taken to reduce sorting errors and an additional process for correct identification may be considered necessary. If this is to be done by checking the performance characteristics of the products, it can be carried out only after the completion of all production steps.

SUMMARY OF THE INVENTION

It is therefore an object of the present invention to provide a method of manufacturing semiconductor devices having marks by which different types of them can be easily distinguished.

The above and other objects of this invention are achieved by manufacturing a semiconductor device having element areas mutually separated by a field $SiO_2$ layer with an identifying pattern created on its surface. Since such a pattern for chip identification may be formed in the step of implanting impurity ions and since such a step is already required for the fabrication of the semiconductor device, the types of chips can be made visually identifiable not necessarily at the end of but also during the fabrication process.

BRIEF DESCRIPTION OF THE DRAWINGS

The accompanying drawings, which are incorporated in and form a part of the specification, illustrate a few embodiments of the present invention and, together with the description, serve to explain the principles of the invention. In the drawings:

FIG. 1 is a cross-sectional view of a silicon semiconductor substrate with which a ROM according to the present invention is fabricated;

FIG. 2 is a cross-sectional view of the substrate shown in FIG. 1 after the mask has been removed;

FIG. 3 is a cross-sectional view of a semiconductor device according to one embodiment of the present invention; and FIG. 4 is a cross-sectional view of a semiconductor device according to another embodiment of the present invention.

DETAILED DESCRIPTION OF THE INVENTION

In FIG. 1, numeral 1 indicates a silicon semiconductor substrate with which a ROM according to the present invention is fabricated. On the surface of the substrate 1 except the element areas, there is formed by thermal oxidation a field $SiO_2$ layer 2 which is thicker than the gate oxide layers. A surface area on the field $SiO_2$ layer 2 on which no wiring is going to be provided in a later fabrication step is identified as the chip identification area and impurities 3 are introduced by ion implantation to the $SiO_2$ surface of this chip identification area in the same fabrication step of impurity ion implantation, for example, for the depletion of the element areas. In order to make it easier to identify the types of chips, it is preferable to assign different patterns to different types of chips and a mask 4 corresponding to a selected pattern is formed on the field $SiO_2$ layer 2 before the implantation of impurities. Thus, impurity ions are implanted through this mask 4.

Thereafter, the mask 4 is removed as shown in FIG. 2. Areas of the $SiO_2$ layer 2 where ion implantation has taken place and areas where it has not have different etching speeds. Thus, indentations 5 as shown in FIG. 3 generally result when the ion-implanted substrate surface is exposed to an etching liquid. FIG. 3 shows a situation in which areas where impurity ions have been implanted have a larger etching speed. Such indentations 5 formed in a pattern can be easily recognized by visual observation of the field $SiO_2$ surface.

The production process for the semiconductor device may be continued with the $SiO_2$ surface exposed as the chip identification area as explained above. If the indentations 5 are shallow, however, there is the danger that the pattern may disappear or become illegible, for example, by a subsequent etching process. For this reason, a polysilicon layer 6 may be formed on the chip identification area as shown in FIG. 4 in the same fabrication step for the formation of the polysilicon layer to become the gate electrode of a MOSFET or the like. The polysilicon layer 6 has the effect of making the indentations 5 below on the field $SiO_2$ surface more clearly discernible.

A passivation layer 7 of phospho-silicate glass PSG and the like with a protective layer 8 thereabove is formed on the substrated surface by chemical vapor deposition in a subsequent fabrication step. Since the passivation layer 7 covering the field $SiO_2$ surface may make the identification pattern less easily legible, however, a contact etching process may be used to remove it as shown in FIG. 4.

In summary, the present invention makes it possible to easily identify the types of semiconductor chip merely by observing the patterns on the chips surfaces. With respect to devices like ROM chips produced by ion implantation which cannot be distinguished easily from their external appearance alone, the present invention is particularly useful because types of such devices can be made easily identifiable without adding an extra step in the fabrication process. The foregoing description of embodiments of the invention has been presented for purposes of illustration and description. It is not intended to be exhaustive or to limit the invention to the precise form disclosed, and obviously many modifications and variations are possible in light of the above teaching. Such modifications and variations which may be apparent to a person skilled in the art are to be considered within the scope of this invention.

What is claimed is:

1. A method of producing a read-only memory into which data are written by ion implantion, said method comprising the steps of identifying element areas and non-element areas on a main surface of a semiconductor substrate, forming a field oxide layer on said non-element areas, identifying on said field oxide layer a chip identification area and wiring areas, forming a mask over said field oxide layer, said mask having an identification pattern over said chip identification area, said identification pattern being indicative of the type of said read-only memory, thereafter implanting impurity ions simultaneously on said main surface of said substrate and through said mask on said field oxide layer inclusive of said chip identification area, thereafter removing said mask from said field oxide layer, and thereafter subjecting said ion-implanted surfaces simultaneously to an etching treatment to thereby form protrusions and indentations on said chip identification area of said field oxide layer according to said identification pattern on said mask.

2. The method of claim 1 further comprising the step of forming a polysilicon layer over said indentations and protrusions on said chip identification area.

3. The method of claim 2 further comprising the step of forming a passivation layer over said main surface of said substrate and said oxide layer after said polysilicon layer is formed.

4. The method of claim 2 further comprising the step of removing said passivation layer from said chip identification area by a contact etching process.

5. The method of claim 1 wherein said substrate comprises silicon.

6. The method of claim 1 wherein said field oxide layer comprises $SiO_2$ and is formed by thermal oxidation.

* * * * *